(12) United States Patent
Oh et al.

(10) Patent No.: US 11,610,631 B2
(45) Date of Patent: *Mar. 21, 2023

(54) METHODS OF OPERATING NONVOLATILE MEMORY DEVICES, METHODS OF OPERATING STORAGE DEVICE AND STORAGE DEVICES

(71) Applicant: SAMSUNG ELECTRONICS CO., LTD., Suwon-si (KR)

(72) Inventors: Shin-Ho Oh, Yongin-si (KR);
Min-Cheol Kwon, Yongin-si (KR);
Sang-Kwon Moon, Hwaseong-si (KR);
Sang-Won Jung, Busan (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/316,463

(22) Filed: May 10, 2021

(65) Prior Publication Data
US 2021/0264985 A1 Aug. 26, 2021

Related U.S. Application Data

(63) Continuation of application No. 16/543,532, filed on Aug. 17, 2019, now Pat. No. 11,037,628.

(30) Foreign Application Priority Data

Dec. 12, 2018 (KR) .......................... 10-2018-0159593

(51) Int. Cl.
*G11C 16/04* (2006.01)
*G11C 16/10* (2006.01)
*G11C 11/56* (2006.01)
*G11C 16/08* (2006.01)
*G06F 3/06* (2006.01)

(52) U.S. Cl.
CPC ............ *G11C 16/10* (2013.01); *G06F 3/0604* (2013.01); *G06F 3/064* (2013.01); *G06F 3/0679* (2013.01); *G11C 11/5671* (2013.01); *G11C 16/0483* (2013.01); *G11C 16/08* (2013.01)

(58) Field of Classification Search
CPC ..... G11C 16/10; G11C 11/5671; G11C 16/08; G11C 11/5628; G06F 3/0604; G06F 3/064; G06F 11/1448; G06F 11/1469
See application file for complete search history.

(56) References Cited

U.S. PATENT DOCUMENTS 7,505,312 B2 3/2009 Matsunaga et al.
8,130,552 B2 3/2012 Miwa et al.
8,144,512 B2 3/2012 Huang et al.
(Continued)

*Primary Examiner* — Uyen Smet
(74) *Attorney, Agent, or Firm* — Volentine, Whitt & Francos, PLLC

(57) ABSTRACT

A nonvolatile memory device includes multi-level cells in a memory cell array including a plurality of memory blocks, and each of the memory blocks includes a plurality of pages. A method of operating the nonvolatile memory device includes pre-programming multi-bit data in a pre-program block of the memory blocks, dividing the multi-level cells into a plurality of state groups based on state codes indicating states of the multi-level cells to generate digest data indicating state group codes corresponding to the state groups, and programming the digest data in a digest block of the memory blocks.

5 Claims, 20 Drawing Sheets

(56) References Cited

U.S. PATENT DOCUMENTS

| | | |
|---|---|---|
| 8,355,280 B2 | 1/2013 | Yoon et al. |
| 8,391,062 B2 | 3/2013 | Jang |
| 8,767,475 B2 | 7/2014 | Cho et al. |
| 8,812,773 B2 | 8/2014 | Kim et al. |
| 9,870,169 B2 | 1/2018 | Ramalingam et al. |
| 2013/0141974 A1* | 6/2013 | Jang ............ G11C 16/04 365/185.03 |
| 2017/0110185 A1 | 4/2017 | Hahn et al. |
| 2019/0006004 A1 | 1/2019 | Shin |

* cited by examiner

METHODS OF OPERATING NONVOLATILE MEMORY DEVICES, METHODS OF OPERATING STORAGE DEVICE AND STORAGE DEVICES

CROSS-REFERENCE TO RELATED APPLICATION

This is a Continuation of U.S. application Ser. No. 16/543,532, filed Aug. 17, 2019, and a claim of priority under 35 U.S.C. § 119 is made to Korean Patent Application No. 10-2018-0159593, filed on Dec. 12, 2018, in the Korean Intellectual Property Office (KIPO), the entire contents of which are hereby incorporated by reference.

BACKGROUND

The present inventive concepts herein generally relate to memory devices, and more particularly to methods of operating nonvolatile memory devices, methods of operating storage devices and storage devices.

Semiconductor memory devices may be classified into volatile memory and nonvolatile memory. Volatile memory may lose content stored therein when powered-off. Nonvolatile memory may retain stored content even when powered-off. Characteristics of flash memory, which is a nonvolatile memory device, include mass storage capability, relatively high noise immunity, and low power operation. Flash memory devices are therefore employed in various fields. For example, mobile systems such as smart-phones, tablet PC or the like typically employ flash memory as storage medium.

In an effort to increase storage capacity, there has been recent interest in flash memory formed of multi-level cells which store two or more bits of data per cell.

SUMMARY

Embodiments of the inventive concepts provide a method of operating a nonvolatile memory device, capable of enhancing program performance and efficiency of storage space.

Embodiments of the inventive concepts provide a method of operating a storage device, capable of enhancing program performance and efficiency of storage space.

Embodiments of the inventive concepts provide a nonvolatile memory device capable of enhancing program performance and efficiency of storage space.

Embodiments of the inventive concepts provide a method of a nonvolatile memory device that includes a memory cell array including a plurality of memory blocks, and each of the plurality of memory blocks includes a plurality of pages. The method includes pre-programming multi-bit data in multi-level cells in a pre-program block of the plurality of memory blocks; dividing the multi-level cell into a plurality of state groups based on state codes indicating states of the multi-level cells after the pre-programming the multi-bit data, to generate digest data indicating state group codes corresponding to the plurality of state groups; and programming the digest data in a digest block of the plurality of memory blocks.

Embodiments of the inventive concepts further provide a method of operating a storage device including a nonvolatile memory device and a controller configured to control the nonvolatile memory device. The nonvolatile memory device includes a plurality of memory blocks and each of the memory blocks includes a plurality of pages. The method includes pre-programming multi-bit data in multi-level cells in a pre-program block of the plurality of memory blocks as pre-programmed multi-bit data; dividing the multi-level cells into a plurality of state groups based on state codes indicating states of the multi-level cells after the pre-programming the multi-bit data, to generate digest data indicating state group codes corresponding to the plurality of state groups; programming the digest data in a digest block of the plurality of memory blocks; recovering, by the controller, a target data based on the pre-programmed multi-bit data and the digest data; and re-programming the recovered target data in the multi-level cells in the pre-program block.

Embodiments of the inventive concepts still further provide a storage device including a nonvolatile memory device and a controller that controls the nonvolatile memory device. The nonvolatile memory device includes a memory cell array. The memory cell array includes a plurality of memory blocks, and each of the plurality of memory blocks including a plurality of pages. The controller controls the nonvolatile memory device such that the nonvolatile memory device performs a pre-program that pre-programs multi-bit data in multi-level cells in a pre-program block of the plurality of memory blocks; divides the multi-level cells into a plurality of state groups based on state codes indicating states of the multi-level cells after the pre-program, to generate digest data indicating state group codes corresponding to the plurality of state groups; and performs a digest program that programs the digest data in a digest block of the plurality of memory blocks.

Accordingly, the nonvolatile memory device or the storage device pre-programs multi-bit data in multi-bit cells in a pre-program block and programs digest data generated based on state codes of the pre-programmed multi-bit data in a digest block, thereby enhancing program performance and efficiency of storage space.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Various example embodiments will be described more fully hereinafter with reference to the accompanying drawings, in which some example embodiments are shown.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
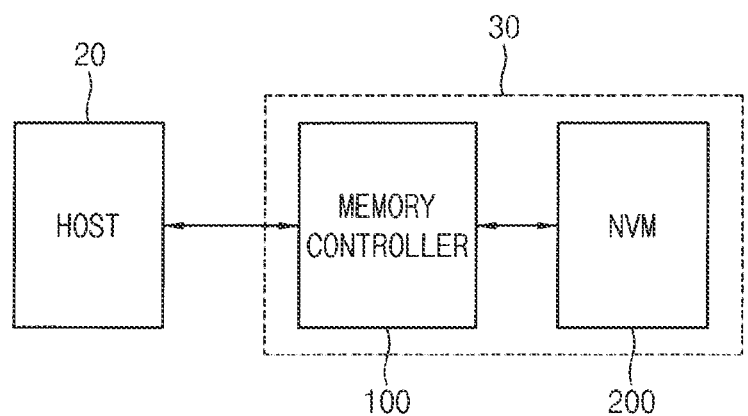
FIG. 1 illustrates a block diagram of an electronic device according to embodiments of the inventive concepts.

FIG. 1 illustrates a block diagram of an electronic device according to embodiments of the inventive concepts.

Referring to FIG. 1, an electronic device 10 includes a host 20 and a store device (or, a memory system) 30. The storage device 30 includes a memory controller (or, a controller) 100 and at least one nonvolatile memory device (NVM) 200. The host 20 may control overall operation of the storage device 30.

The nonvolatile memory device 200 may be implemented with NAND flash memory. In example embodiments, nonvolatile memory device 200 may include nonvolatile memory such as for example phase change random access memory (PRAM), resistance random access memory (RRAM), magneto-resistive random access memory (MRAM), ferroelectric random access memory (FRAM), or the like.

The memory controller 100 may exchange signals such as commands, addresses, data, etc. with the host 20. The memory controller 100 may write data in the nonvolatile memory device 200 and read data from the nonvolatile memory device 200, according to commands from the host 20.

Figure 2:
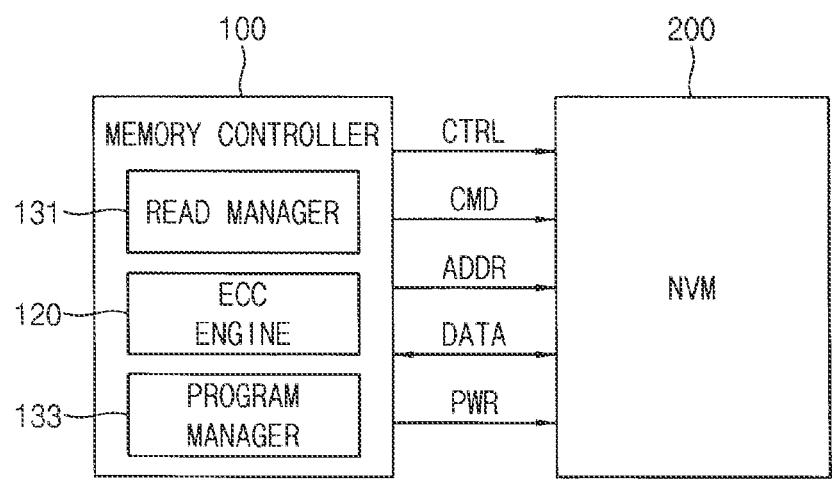
FIG. 2 illustrates a block diagram of the storage device in FIG. 1 according to embodiments of the inventive concepts.

FIG. 2 illustrates a block diagram of the storage device in FIG. 1 according to embodiments of the inventive concepts.

Referring to FIG. 2, the storage device 30 includes the memory controller 100 and the at least one nonvolatile memory device 200.

In example embodiments, each of the memory controller 100 and the nonvolatile memory device 200 may be provided in the form of a chip, a package, or a module. Alternatively, the memory controller 100 and the nonvolatile memory device 200 may be packaged according to any one of various packaging technologies such as for example package on package (PoP), ball grid arras (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack Package (WSP) and the like.

The nonvolatile memory device 200 may perform an erase operation, a program operation or a write operation under control of the memory controller 100. The nonvolatile memory device 200 may receive a command CMD, an address ADDR and data DATA through input/output lines from the memory controller 100 for performing such operations. In addition, the nonvolatile memory device 200 may receive a control signal CTRL from the memory controller 100 through a control line. In addition, the nonvolatile memory device 200 may receive power PWR from the memory controller 100 through a power line.

Memory cells of the nonvolatile memory device 200 have the physical characteristic that a threshold voltage distribution varies due to causes such as for example program elapsed time, temperature, program disturbance, and read disturbance, among other causes. For example, data stored at the nonvolatile memory device 200 may become erroneous due to the above causes. The memory controller 100 utilizes a variety of error correction techniques to correct such errors. For example, the memory controller 100 includes an error correction code (ECC) engine (unit) 120 and a read manager 131. In addition, the memory controller 100 includes a program manager 133 that manages various program operations.

During a read operation, the memory controller 100 may read data stored at a first page of the nonvolatile memory device 200, using a default read voltage set. The default read voltage set may include predetermined read voltages. The ECC engine 120 may detect and correct errors included in data read from the nonvolatile memory device 200. In example embodiments, the ECC engine 120 may be implemented in the form of hardware.

Data read in a read operation may include more error bits than the ECC engine 120 can correct. In such a case, the ECC engine 200 fails to correct the errors of the data, and the corresponding data may be referred to as including or having an 'uncorrectable error correction code (UECC) error'. Data having the UECC error may be referred to as an 'UECC data'.

When data read by means of the default read voltage set includes the UECC error, the read manager 131 may for example adjust a read voltage set of the nonvolatile memory device 200. The memory controller 100 sends an address ADDR, a command CMD, and a control signal CTRL such that the nonvolatile memory device 200 performs a read operation by means of the read voltage set thus adjusted.

The adjusted read voltage set may be included in the control signal CTRL or the command CMD. The ECC engine 120 detects and corrects an error of data that is read using the adjusted read voltage set.

In example embodiments, the read manager 131 may adjust a read voltage set a predetermined number of times, and the ECC engine 120 may detect and correct an error of data that is read using the adjusted read voltage set. For example, the memory controller 100 may repeat a set of operations the predetermined number of times, the set of operations including adjusting a read voltage set, reading data using the adjusted read voltage set, and correcting an error of the read data.

When an error of read data is corrected during iteration of the set of operations, the memory controller 100 outputs corrected data to the host 20. When a read operation is iterated under control of the read manager 131, for example, read data or particular page data of the read data is stored in a buffer (such as buffer 130 in FIG. 3). The buffer 130 may be a static random access memory (SRAM).

When an error of read data is not corrected after iteration of the set of operations (i.e., when the UECC error occurs), the memory controller 100 determines a starting voltage set for performing a valley search operation based on the data stored in the buffer 130.

In example embodiments of the inventive concepts, iteration of adjusting a read voltage set and reading data using the adjusted read voltage set may be omitted.

When an error of read data is not corrected after the read operation based on the default read voltage set or after iteration of the set of operations, the memory controller 100 selects a program state which includes a highest error bit ratio, from among the data stored in the buffer 130, and determines a read voltage corresponding to the selected program state as the starting voltage set. The read manager 131 performs a valley search operation based on the determined starting voltage set to determine an optimal read level voltage, and performs a recovery read operation on the read data based on the optimal read level voltage.

For determining the optimal read level voltage, the read manager 131 sets a search region defined by a starting read voltage and ending read voltage, determines whether the search region belongs to a reference region, changes the search region if the search region does not belong to the reference region, and finds new read voltage to determine the optimal read level voltage if the search region belongs to the reference region.

The program manager 133 may manage program operation on multi-level cells in the nonvolatile memory device 200. The program manager 133 may control the nonvolatile memory device 200 such that the nonvolatile memory device 200 performs a pre-program to pre-program multi-bit data in multi-level cells in a pre-program block in the memory cell array, and performs a digest program to program digest data in a digest block in the memory cell array. The digest data may be generated based on state codes indicating states of the multi-level cells. In addition, the program manager 133 controls the nonvolatile memory device 200 to recover target data based on the pre-programmed multi-bit data and the digest data, and to re-program the recovered target data in the multi-level cells in the pre-program block.

The program manager 133 may selectively program a scheme such as single-level cell buffering, digest program and re-program to the nonvolatile memory device 200 based at least on one of performance of the nonvolatile memory device 200, efficiency of storage space and credibility.

Figure 3:
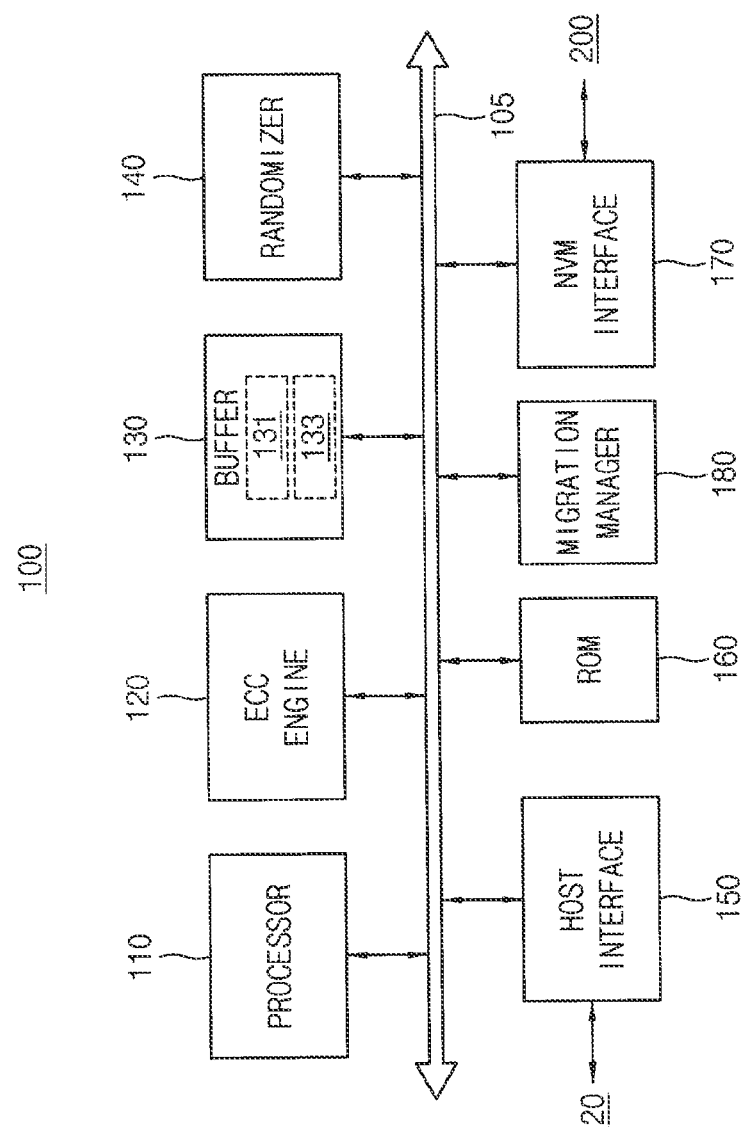
FIG. 3 illustrates a block diagram of the memory controller in the storage device of FIG. 2 according to embodiments of the inventive concepts.

FIG. 3 illustrates a block diagram of the memory controller in the storage device of FIG. 2 according to embodiments of the inventive concepts.

Referring to FIGS. 2 and 3, the memory controller 100 includes a processor 110, the ECC engine 120, the buffer 130, a randomizer 140, a host interface 150, a read only memory (ROM) 160, a migration manager 180 and a nonvolatile memory interface 170 which are connected via a bus 105. The buffer 130 includes the read manager 131 and the program manager 133. The ECC engine 120, the buffer 130, the read manager 131 and the program manager 133 are described with reference to FIG. 2, and further description thereof may be omitted from the following.

The processor 110 controls an overall operation of the memory controller 100. In example embodiments, the read manager 131 and the program manager 133 may be implemented in software and stored in the buffer 130. The read manager 131 and the program manager 133 stored in the buffer 130 may be driven by the processor 110. The ROM 160 stores a variety of information, needed for the memory controller 100 to operate, in firmware.

The randomizer 140 randomizes data to be stored in the nonvolatile memory device 200. For example, the randomizer 140 randomizes data to be stored in the nonvolatile memory device 200 by word-line.

The data randomizing processes data such that program states of memory cells connected to a word-line have the same ratio. For example, if memory cells connected to one word-line are multi-level cells (MLC) each storing 4-bit data, each of the memory cells has one of an erase state and first through fifteenth program states. In this case, the randomizer 140 randomizes data such that in memory cells connected to one word-line, the number of memory cells having the erase state, and each of the number of memory cells having the first through fifteenth program states are substantially the same as one another. For example, memory cells in which randomized data is stored have program states of which the number is equal to one another. The randomizer 140 de-randomizes data read from the nonvolatile memory device 200.

The randomizer 140 randomizes page data. For the sake of easy understanding, an ideal operation of the randomizer 140 has been described. However, the inventive concepts are not limited thereto. For example, the randomizer 140 may randomize data such that in memory cells connected to one word-line, the number of memory cells having the erase state and each of the number of memory cells having the first through fifteenth program states are approximate to the same value. For example, memory cells in which randomized data is stored have program states of which the number is similar to one another.

The migration manager 180 may manage migration of pre-programmed data and digest data. The migration manager 180 may migrate pre-programmed data and digest data corresponding to the pre-programmed data to a logic circuit 190 (refer to FIG. 21B). If migration of the digest data is completed, the migration manager 180 notifies the processor 110 of completion of the migration of the digest data, and the processor 110 controls the nonvolatile memory device 200 to perform an erase operation on the digest block.

The memory controller 100 communicates with the host 20 through the host interface 150. The host interface 150 may be configured according any of a variety of different communication protocols such as for example Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI®), Nonvolatile memory express (NVMe), Universal Flash Storage (UFS), or the like. The memory controller 100 communicates with the nonvolatile memory device 200 through the nonvolatile memory interface 170.

Figure 4:
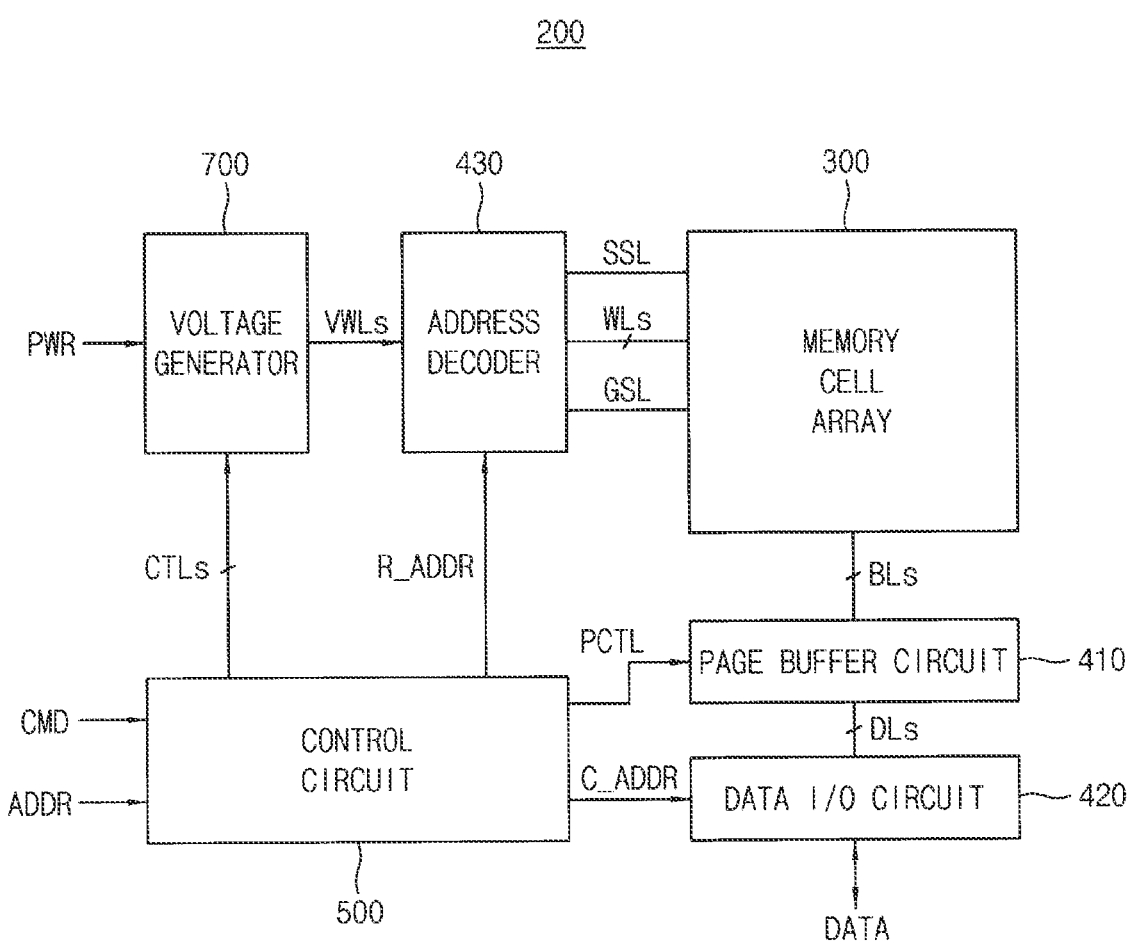
FIG. 4 illustrates a block diagram of the nonvolatile memory device in the storage device of FIG. 2 according to embodiments of the inventive concepts.

FIG. 4 illustrates a block diagram of the nonvolatile memory device in the storage device of FIG. 2 according to embodiments of the inventive concepts.

Referring to FIG. 4, the nonvolatile memory device 200 includes a memory cell array 300, an address decoder 430, a page buffer circuit 410, a data input/output (I/O) circuit 420, a control circuit 500 and a voltage generator 700.

The memory cell array 300 is coupled to the address decoder 430 through one or more string selection lines SSL, a plurality of word-lines WLs, and one or more ground selection lines GSL. In addition, the memory cell array 300 is coupled to the page buffer circuit 410 through a plurality of bit-lines BLs.

The memory cell array 300 may include a plurality of memory cells coupled to the plurality of word-lines WLs and the plurality of bit-lines BLs.

In some example embodiments, the memory cell array 300 may be a three-dimensional memory cell array, which is formed on a substrate in a three-dimensional structure (or a vertical structure). In this case, the memory cell array 300 may include vertical cell strings that are vertically oriented such that at least one memory cell is located over another memory cell.

In other example embodiments, the memory cell array 300 may be a two-dimensional memory cell array, which is formed on a substrate in a two-dimensional structure (or a horizontal structure).

Figure 5:
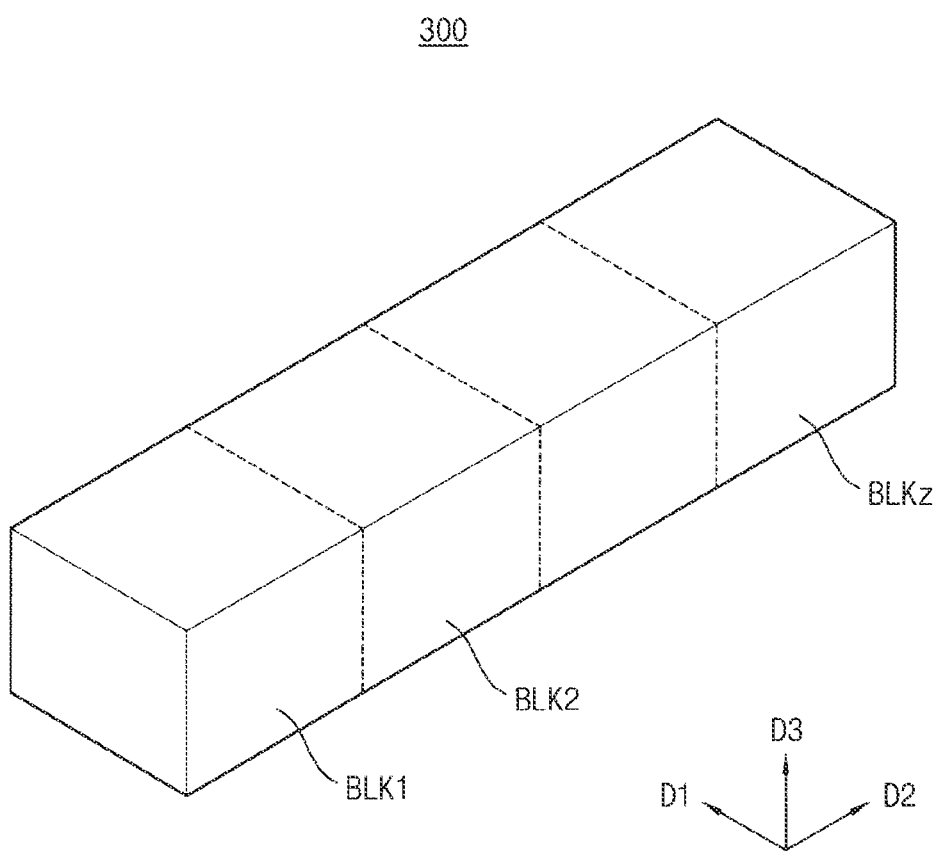
FIG. 5 illustrates a block diagram of the memory cell array in FIG. 4.

FIG. 5 is a block diagram illustrating the memory cell array in FIG. 4.

Referring to FIG. 5, the memory cell array 300 may include a plurality of memory blocks BLK1 to BLKz (z is an integer greater than two) that extends along first through third directions D1, D2 and D3. In an embodiment, the memory blocks BLK1 to BLKz are selected by the address decoder 430 in FIG. 4. For example, the address decoder 430 may select a memory block BLK corresponding to a block address among the memory blocks BLK1 to BLKz.

Figure 6:
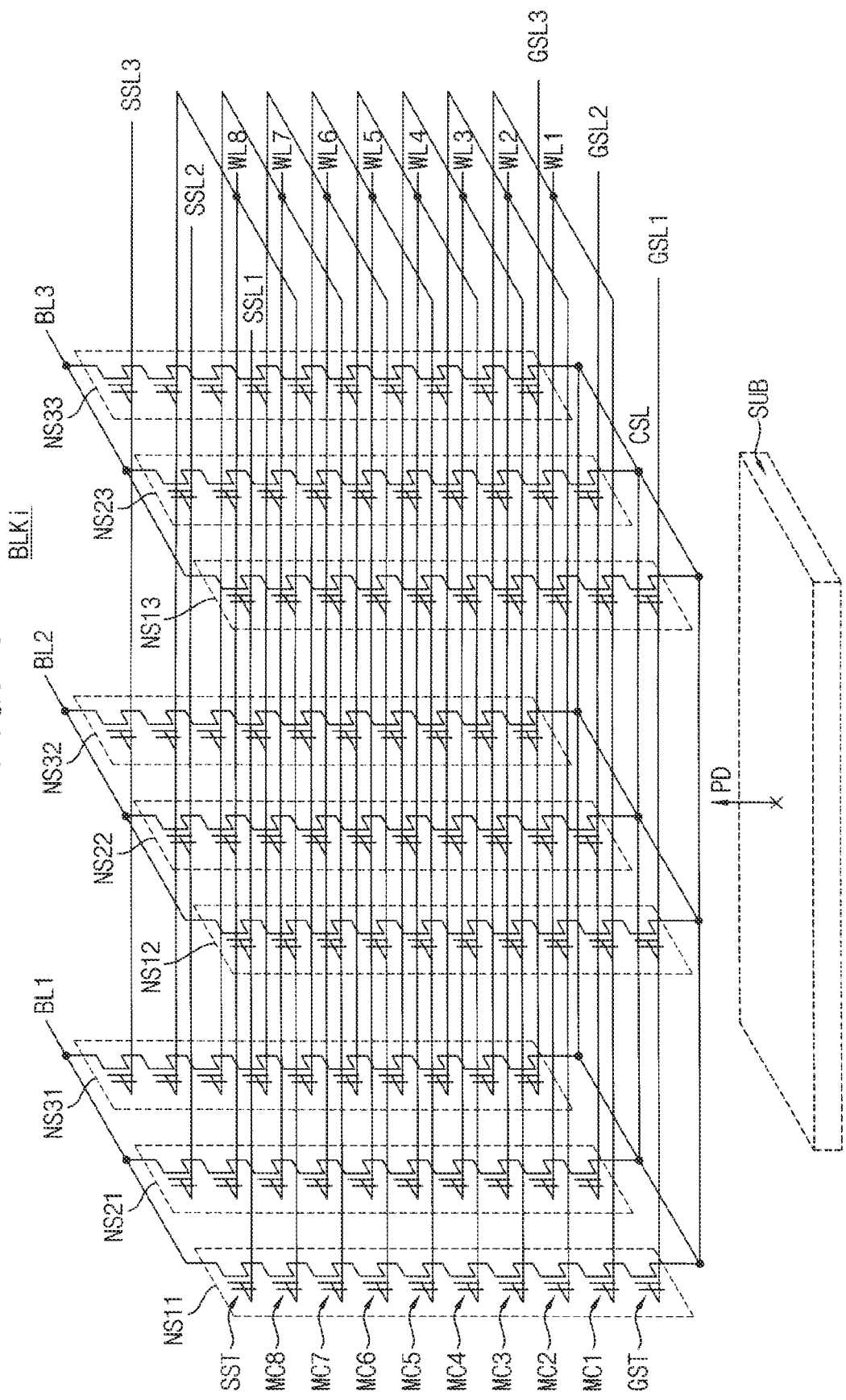
FIG. 6 illustrates a circuit diagram of one of the memory blocks in FIG. 5.

FIG. 6 illustrates a circuit diagram of one of the memory blocks in FIG. 5.

The memory block BLKi of FIG. 6 may be formed on a substrate in a three-dimensional structure (or a vertical structure). For example, a plurality of memory cell strings included in the memory block BLKi may be formed in a direction PD perpendicular to the substrate.

Referring to FIG. 6, the memory block BLKi may include memory cell strings NS11 to NS33 (i.e., NS11, NS12, NS13, NS21, NS22, NS23, NS31, NS32 and NS33) coupled between bit-lines BL1, BL2 and BL3 and a common source line CSL. Each of the memory cell strings NS11 to NS33 may include a string selection transistor SST, a plurality of memory cells MC1 to MC8 (i.e., MC1, MC2, MC3, MC4, MC5, MC6, MC7 and MC8), and a ground selection transistor GST. In FIG. 6, each of the memory cell strings NS11 to NS33 is illustrated as including eight memory cells MC1 to MC8. However, example embodiments are not limited thereto. In some example embodiments, each of the memory cell strings NS11 to NS33 may include any number of memory cells.

The string selection transistors SST may be connected to corresponding string selection lines SSL1, SSL2 and SSL3. The plurality of memory cells MC1 to MC8 may be connected to corresponding word-lines WL1 to WL8 (i.e., WL1, WL2, WL3, WL4, WL5, WL6, WL7 and WL8), respectively. The ground selection transistors GST may be connected to corresponding ground selection lines GSL1, GSL2 and GSL3. The string selection transistors SST may be connected to corresponding bit-lines BL1, BL2 and BL3, and the ground selection transistors GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 6, the memory block BLKi is illustrated to be coupled to eight word-lines WL1 to WL8 and three bit-lines BL1 to BL3. However, example embodiments are not limited thereto. In some example embodiments, the memory cell array 300 may be coupled to any number of word-lines and bit-lines.

Figure 7:
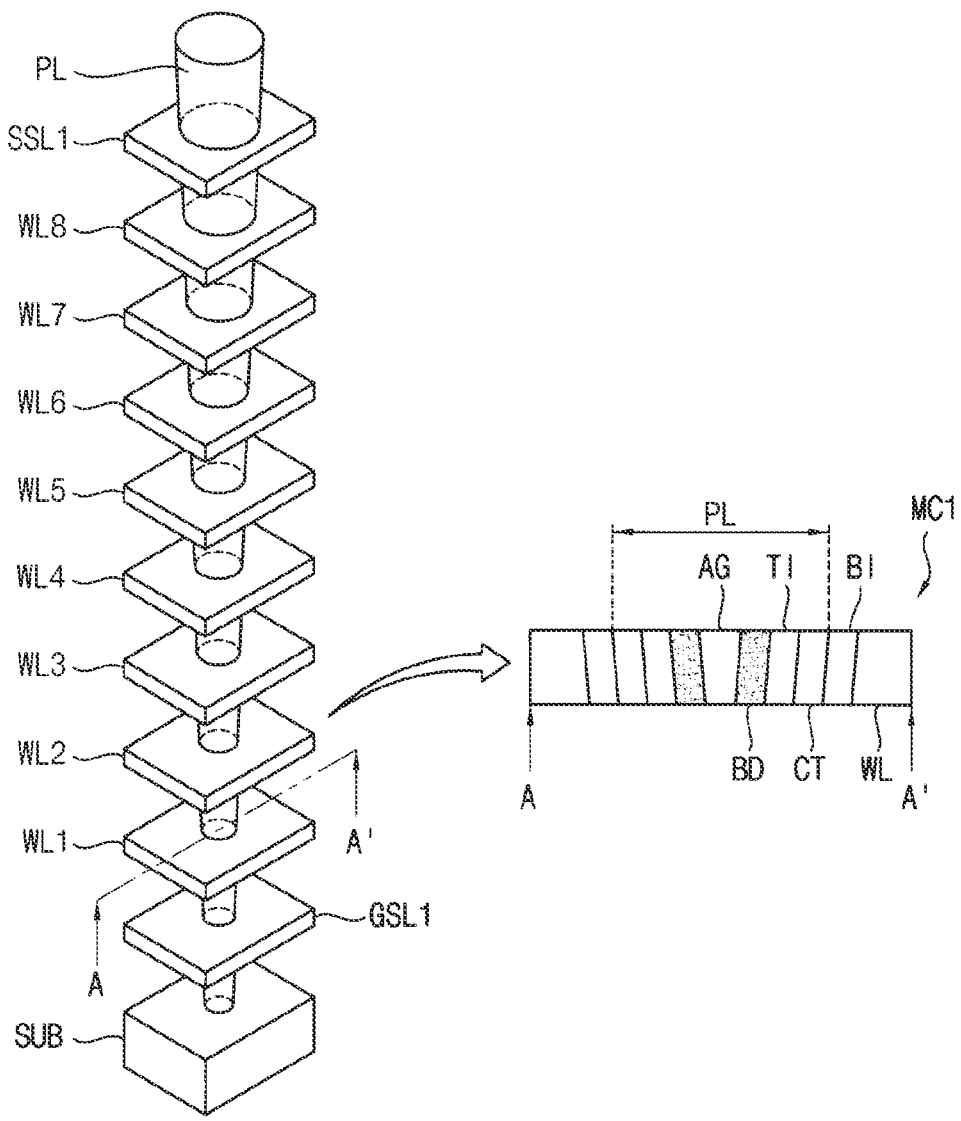
FIG. 7 illustrates an example of a structure of a cell string in the memory block of FIG. 8.
Figure 8:
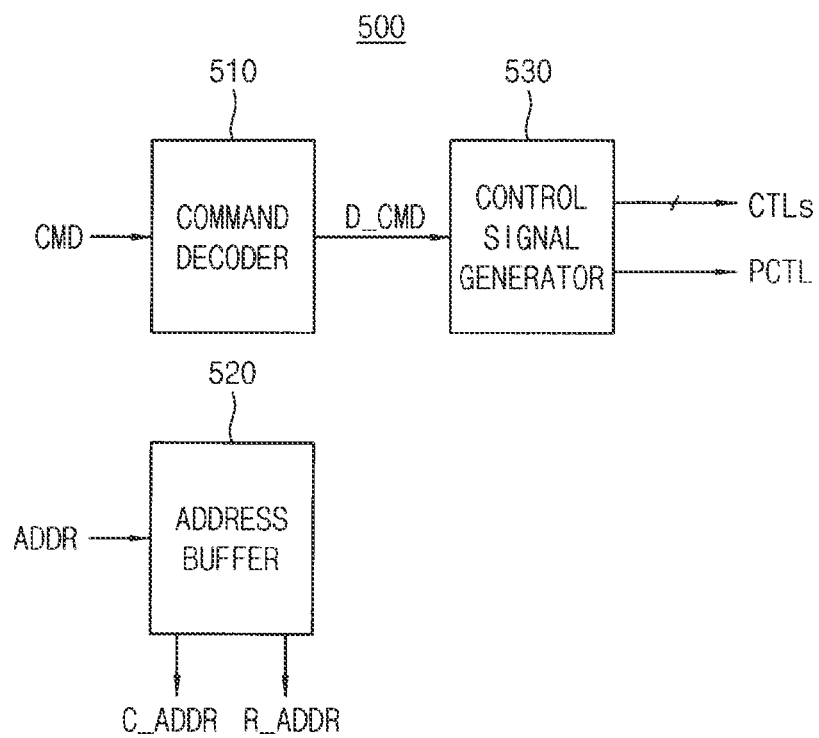
FIG. 8 illustrates a block diagram of the control circuit in the nonvolatile memory device of FIG. 4 according to embodiments of the inventive concepts.

FIG. 7 illustrates an example of a structure of a cell string in the memory block of FIG. 8.

Referring to FIGS. 6 and 7, a pillar PL is provided on the substrate SUB such that the pillar PL extends in a direction perpendicular to the substrate SUB to make contact with the substrate SUB. Each of the ground selection line GSL, the word lines WL1 to WL8, and the string selection lines SSL illustrated in FIG. 7 may be formed of a conductive material disposed to be parallel with the substrate SUB. For example, the conductive material may be a metallic material. The pillar PL may be in contact with the substrate SUB through the conductive materials forming the string selection lines SSL, the word lines WL1 to WL8, and the ground selection line GSL.

A sectional view taken along a line A-A' is also illustrated in FIG. 7. In an embodiment, a sectional view of a first memory cell MC1 corresponding to a first word line WL1 is illustrated. The pillar PL may include a cylindrical body BD. An air gap AG may be defined in the interior of the body BD.

The cylindrical body BD may include P-type silicon and may be an area where a channel will be formed. The pillar PL may further include a cylindrical tunnel insulating layer TI surrounding the cylindrical body BD, and a cylindrical charge trap layer CT surrounding the cylindrical tunnel insulating layer TI. A blocking insulating layer BI may be provided between the first word line WL and the pillar PL.

The cylindrical body BD, the cylindrical tunnel insulating layer TI, the cylindrical charge trap layer CT, the blocking insulating layer BI, and the first word line WL may constitute a charge trap type transistor that is formed in a direction perpendicular to the substrate SUB or perpendicular to an upper surface of the substrate SUB. The string selection transistors SST, the ground selection transistors GST, and other memory cells may have the same structure as the first memory cell MC1.

Referring back to FIG. 4, the control circuit 500 may receive a command (signal) CMD and an address (signal) ADDR from the memory controller 100, and control an erase loop, a program loop and a read operation of the nonvolatile memory device 200 based on the command signal CMD and the address signal ADDR.

The program loop may include a program operation and a program verification operation. The erase loop may include an erase operation and an erase verification operation. The read operation may include a default read operation and recovery read operation.

For example, the control circuit 500 may generate control signals CTLs, which are used for controlling the voltage generator 700 and a control signal PCTL for controlling the page buffer circuit 410, based on the command signal CMD, and may generate a row address R_ADDR and a column address C_ADDR based on the address signal ADDR. The control circuit 500 may provide the row address R_ADDR to the address decoder 430 and provide the column address C_ADDR to the data input/output circuit 420.

The address decoder 430 is coupled to the memory cell array 300 through the one or more string selection lines SSL, the plurality of word-lines WLs, and the one or more ground selection lines GSL. During the program operation or the read operation, the address decoder 430 may determine one of the plurality of word-lines WLs as a selected word-line, and determine the rest of the plurality of word-lines WLs except for the selected word-line as unselected word-lines based on the row address R_ADDR.

The voltage generator 700 may generate word-line voltages VWLs, which are required for the operation of the nonvolatile memory device 200, based on the control signals CTLs from the control circuit 500. The voltage generator 700 may receive power PWR from the memory controller 100. The word-line voltages VWLs may be applied to the plurality of word-lines WLs through the address decoder 430.

For example, during the erase operation, the voltage generator 700 may apply an erase voltage to a well of the memory block and may apply a ground voltage to all word-lines of the memory block. During the erase verification operation, the voltage generator 700 may apply an erase verification voltage to the all of the word-lines of the memory block, or may sequentially apply the erase verification voltage to word-lines on a word-line basis.

For example, during the program operation, the voltage generator 700 may apply a program voltage to the selected word-line and may apply a program pass voltage to the unselected word-lines. In addition, during the program verification operation, the voltage generator 700 may apply a program verification voltage to the selected word-line and may apply a verification pass voltage to the unselected word-lines.

In addition, during the default read operation, the voltage generator 700 may apply a default read voltage to the selected word-line and may apply a read pass voltage to the unselected word-lines. During the recovery read operation, the voltage generator 700 may apply the optimal read level voltage to the selected word-line.

The page buffer circuit 410 is coupled to the memory cell array 300 through the plurality of bit-lines BLs. The page buffer circuit 410 may include a plurality of page buffers. In some example embodiments, one page buffer may be connected to one bit-line. In other example embodiments, one page buffer may be connected to two or more bit-lines.

The page buffer circuit 410 may temporarily store data to be programmed in a selected page, or data read out from the selected page.

The data input/output circuit 420 is coupled to the page buffer circuit 410 through data lines DLs. During the program operation, the data input/output circuit 420 may receive program data DATA from the memory controller 100 and provide the program data DATA to the page buffer circuit 410 based on the column address C_ADDR received from the control circuit 500. During the read operation, the data input/output circuit 420 may provide read data DATA, which are stored in the page buffer circuit 410, to the memory controller 100 based on the column address C_ADDR received from the control circuit 500.

FIG. 8 illustrates a block diagram of the control circuit in the nonvolatile memory device of FIG. 4 according to embodiments of the inventive concepts.

Referring to FIG. 8, the control circuit 500 includes a command decoder 510, an address buffer 520 and a control signal generator 530.

The command decoder 510 decodes the command CMD and provides a decoded command D_CMD to the control signal generator 530. For example, when the decoded command D_CMD is a read command, the command decoder 510 provides the decoded command D_CMD to the to the control signal generator 530.

The address buffer 520 receives the address signal ADDR, provides the row address R_ADDR to the address decoder 430 and provides the column address C_ADDR to the data input/output circuit 420.

The control signal generator 530 receives the decoded command D_CMD, generates the control signals CTLs based on an operation directed by the decoded command D_CMD and provides the control signals CTLs to the voltage generator 700. In addition, the control signal generator 530 generates the control signal PCTL based on an operation directed by the decoded command D_CMD, and provides the control signal PCTL to the page buffer circuit 410.

Figure 9:
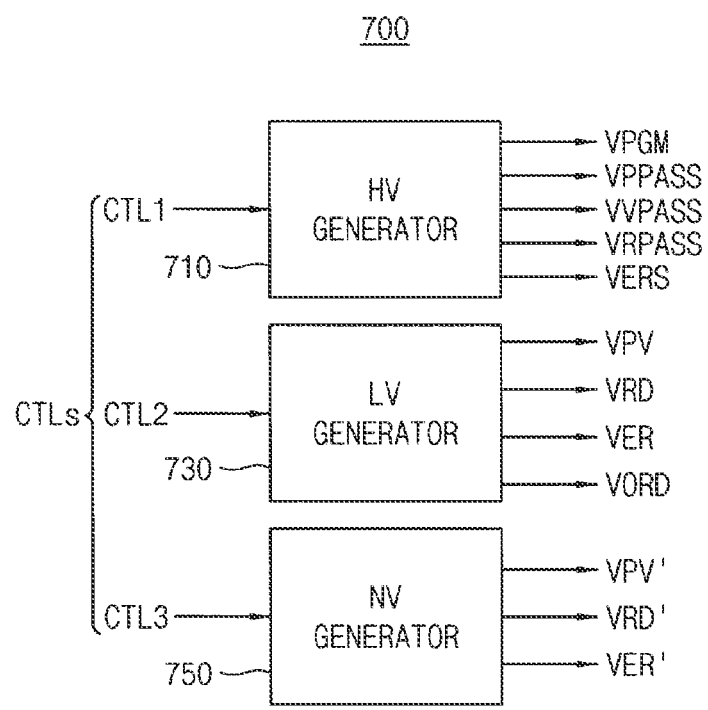
FIG. 9 illustrates a block diagram of the voltage generator in the nonvolatile memory device of FIG. 4 according to embodiments of the inventive concepts.

FIG. 9 illustrates a block diagram of the voltage generator in the nonvolatile memory device of FIG. 4 according to embodiments of the inventive concepts.

Referring to FIG. 9, the voltage generator 700 includes a high voltage (HV) generator 710 and a low voltage (LV) generator 730. The voltage generator 700 may further include a negative voltage (NV) generator 750.

The high voltage generator 710 may generate a program voltage VPGM, a program pass voltage VPPASS, a verification pass voltage VVPASS, a read pass voltage VRPASS and an erase voltage VERS according to operations directed by the command CMD, in response to a first control signal CTL1. The program voltage VPGM is applied to the selected word-line, the program pass voltage VPPASS, the verification pass voltage VVPASS, and the read pass voltage VRPASS may be applied to the unselected word-lines, and the erase voltage VERS may be applied to the well of the memory block. The first control signal CTL1 may include a plurality of bits which indicate the operations directed by the command CMD.

The low voltage generator 730 may generate a program verification voltage VPV, a read voltage VRD, an erase verification voltage VER and an optimal read level voltage VORD according to operations directed by the command CMD, in response to a second control signal CTL2. The program verification voltage VPV, the read voltage VRD, the optimal read level voltage VORD and the erase verification voltage VER may be applied to the selected word-line according to operation of the nonvolatile memory device 200. The second control signal CTL2 may include a plurality of bits which indicate the operations directed by the command CMD.

The negative voltage generator 750 may generate a program verification voltage VPV', a read voltage VRD' and an erase verification voltage VER' which have negative levels according to operations directed by the command CMD, in response to a third control signal CTL3. The third control signal CTL3 may include a plurality of bits which indicate the operations directed by the command CMD.

Figure 10:
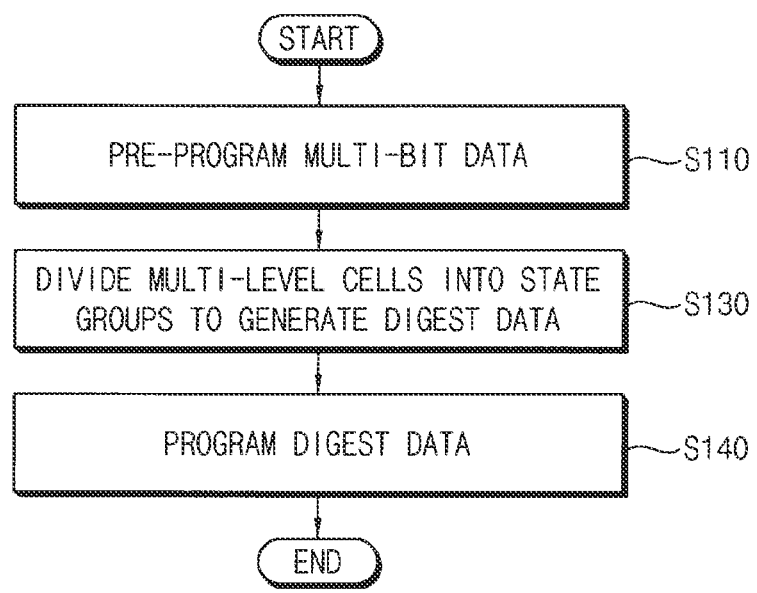
FIG. 10 illustrates a flow chart of a method of operating a nonvolatile memory device according to embodiments of the inventive concepts.

FIG. 10 illustrates a flow chart of a method of operating a nonvolatile memory device according to embodiments of the inventive concepts.

Figure 11:
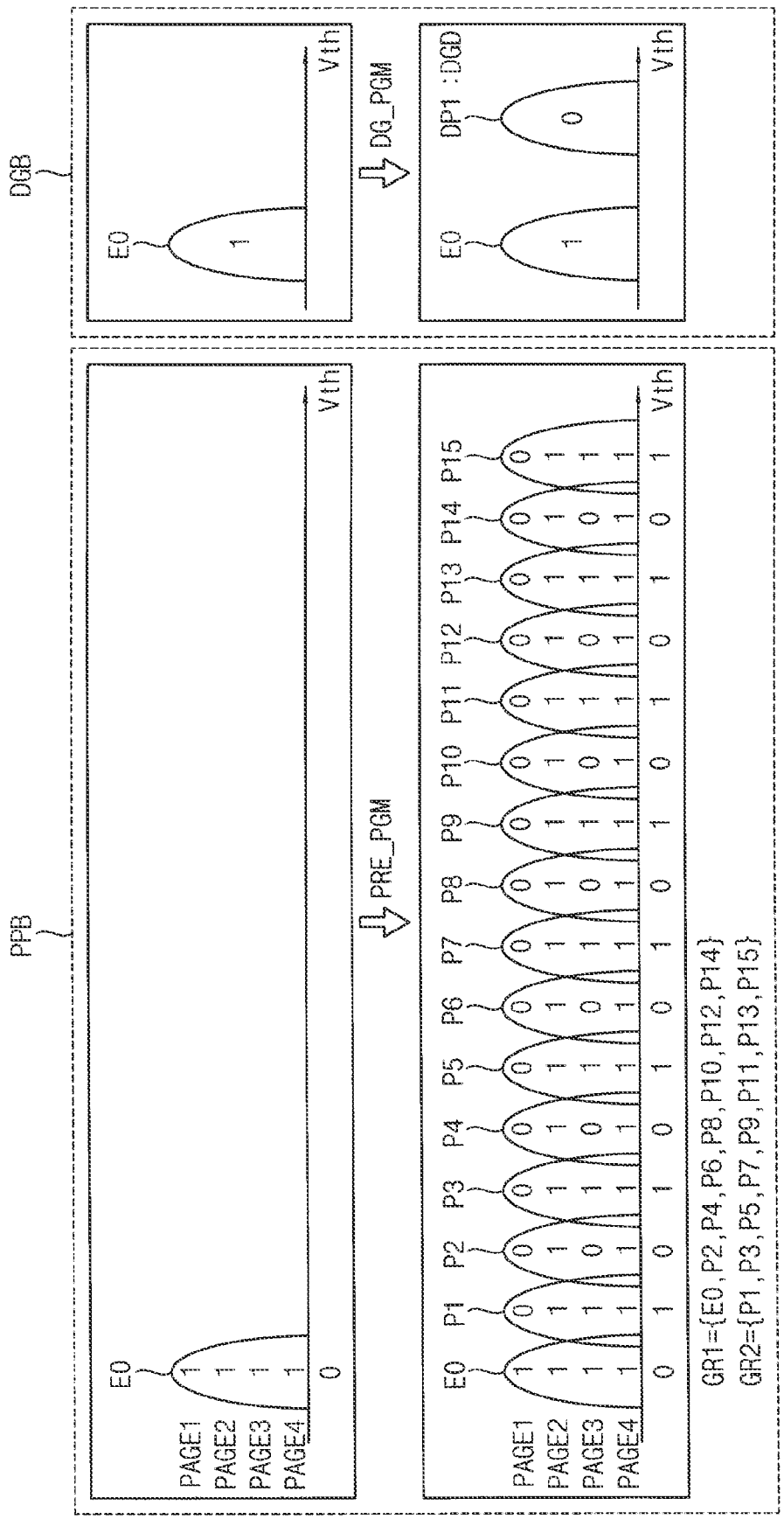
FIG. 11 illustrates a pre-program block and a digest block in the memory cell array of the nonvolatile memory device of FIG. 4.

FIG. 11 illustrates a pre-program block PPG) and a digest block (DGB) in the memory cell array of the nonvolatile memory device of FIG. 4.

Referring to FIGS. 4 through 11, described hereinafter is a method of operating the nonvolatile memory device 200 that includes a memory cell array 300 including a plurality of memory blocks, each of the memory blocks including a plurality of pages. In operation S110, the control circuit 500 controls the voltage generator 700, the address decoder 430 and the page buffer circuit 410 to perform a pre-program PRE_PGM to pre-program multi-bit data in multi-level cells in a pre-program block PPB of the memory blocks.

In operation S130, the control circuit 500 divides the multi-level cells into a plurality of state groups GR1 and GR2 based on state codes indicating states of the multi-level cells, to generate digest data DGD indicating state group codes corresponding to the state groups GR1 and GR2. A first state group GR1 may have a state group code of '0' and a second state group GR2 may have a state group code of '1'. In FIG. 11, the state group codes '0' and '1' are shown in the pre-program block PPG below the horizontal line that represents threshold voltage Vth.

In operation S140, the control circuit 500 controls the voltage generator 700, the address decoder 430 and the page buffer circuit 410 to perform a digest program DG_PGM to program digest data DGD in a digest block DGB of the memory blocks.

In FIG. 11, it is assumed that each of the multi-level cells is capable of storing N-bit data (N is a natural number greater than two) and N is four. Therefore, each of the multi-level cells may have a state code corresponding to one of an erased state E0 and first through fifteenth program states P1~P15. That is, each of the multi-level cells may have a state code corresponding to one of $2^N$ state codes.

The control circuit 500 divides (or groups) the multi-level cells into M state groups (M is a natural number smaller than or equal to N) based on the states codes of the multi-level cells. In FIG. 11, it is assumed that M is two.

In FIG. 11, first page of data PAGE1 through fourth page of data PAGE4 may be sequentially or concurrently pre-programmed in each of the multi-level cells. The control circuit 500 may divide the multi-level cells into the state groups GR1 and GR2 corresponding to a set of non-overlapping threshold voltage distributions.

In example embodiments, the control circuit 500 may divide the multi-level cells into the state groups GR1 and GR2 based on a number of first bits in each of the state codes in each of the multi-level cells, and each of the first bits may have a first logic level. In embodiments are described hereinafter, the first logic level is '1'. However, in other embodiments the first logic level may be '0'.

Therefore, the first state group GR1 may include state codes E0, P2, P4, P6, P8, P10, P12 and P14 having a first set of non-overlapping threshold voltage distributions, or having even number of first bits, respectively. For example, each of the state codes E0, P2, P4, P6, P8, P10, P12 and P14 include an even number of first bits '1'. The second state group GR2 may include state codes P1, P3, P5, P7, P9, P11, P13 and P15 having a second set of non-overlapping threshold voltage distributions, or having odd number of first bits, respectively. For example, each of the state codes P1, P3, P5, P7, P9, P11, P13 and P15 include an odd number of first bits '1'.

Since sixteen state codes E0 and P1 through P15 are divided into the first and second state groups GR1 and GR2, the digest data DGD have two states E0 and DP1, and thus the control circuit 500 may program the digest data DGD in single level cells in the digest block DGB.

Therefore, the data is maintained without completing re-program, and smaller storage space is needed for storing the digest data DGD in single level cells than for storing pages of data in each of the single level cells, because the digest data DGD are programmed in the single level cells. In addition, the memory controller 100 may release the buffer 130 which is used for loading the multi-bit data after one time of pre-program is completed.

For pre-programming the multi-bit data, the control circuit 500 may load the multi-bit data to the page buffer circuit 410 coupled to the multi-level cells. The control circuit 500 may pre-program the multi-bit data loaded to the page buffer circuit 410 in the multi-level cells.

The control circuit 500 generates the digest data DGD based on the state codes of the multi-bit data loaded to the page buffer circuit 410, and may temporarily store the digest data DGD in page buffers of the page buffer circuit 410. The control circuit 500 may generate the digest data DGD by performing logical operation on each of bits in the multi-bit data (as will be described later with respect to the examples of FIGS. 18 and 19).

The control circuit 500 or the memory controller 100 may manage the pre-program block PPB and the digest block DGB as one pair. That is, the pre-program block PPB and the digest block DGB corresponding to the pre-program block PPB may constitute one pair.

In example embodiments, if the state codes are divided into four state groups, the digest block DGB may include multi-level cells to store digest data DGD corresponding to four state groups.

Figure 12:
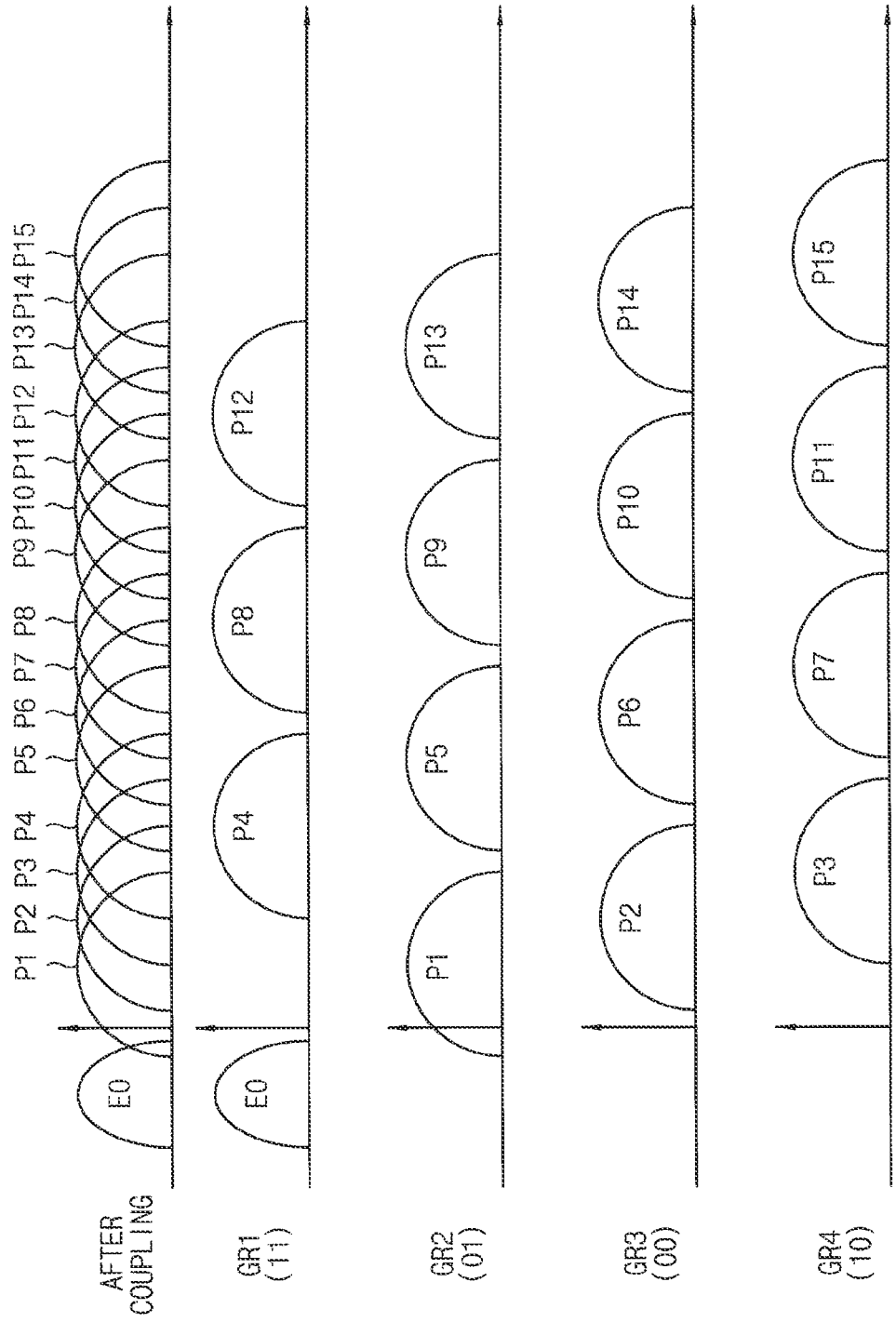
FIG. 12 illustrates a diagram of an example of threshold voltage distributions of the multi-level cells after the pre-program operation.

FIG. 12 illustrates a diagram of an example of threshold voltage distributions of the multi-level cells after the pre-program operation.

FIG. 12 illustrates an example where four bits of data are stored in the multi-level cells.

Referring to FIG. 12, the multi-level cells have threshold voltage distributions E0, P1, P2, P3, P4, P5, P6, P7, P8, P9, P10, P11, P12, P13, P14 and P15 wider than threshold voltage distributions shortly after a pre-program operation. The threshold voltage distributions E0, P1, P2, P3, P4, P5, P6, P7, P8, P9, P10, P11, P12, P13, P14 and P15 overlap with each other.

The threshold voltage distributions E0, P1, P2, P3, P4, P5, P6, P7, P8, P9, P10, P11, P12, P13, P14 and P15 are divided into state groups GR1, GR2, GR3 and GRP4 such that each state group includes a set of non-overlapping threshold voltage distributions. For example, the first through sixteenth threshold voltage distributions E0, P1, P2, P3, P4, P5, P6, P7, P8, P9, P10, P11, P12, P13, P14 and P15 are divided into a first state group GR1, a second state group GR2, a third state group GR3, and a fourth state group GR4.

The first state group GR1 includes the first threshold voltage distribution (i.e., erased state) E0, the fifth threshold voltage distribution (i.e., fourth program state) P4, the ninth threshold voltage distribution (i.e., eighth program state) P8, and thirteenth threshold voltage distribution (i.e., twelfth program state) P12, which do not overlap. The second state group GR2 includes second threshold voltage distribution (i.e., first program state) P1, sixth threshold voltage distribution (i.e., fifth program state) P5, tenth threshold voltage distribution (i.e., ninth program state) P9, and fourteenth threshold voltage distribution (i.e., thirteenth program state) P13, which do not overlap.

The third state group GR3 includes third threshold voltage distribution (i.e., second program state) P2, seventh threshold voltage distribution (i.e., sixth program state) P6, eleventh threshold voltage distribution (i.e., tenth program state) P10, and fifteenth threshold voltage distribution (i.e., fourteenth program state) P14, which do not overlap. The fourth state group GR4 includes fourth threshold voltage distribution (i.e., third program state) P3, eighth threshold voltage distribution (i.e., seventh program state) P7, twelfth threshold voltage distribution (i.e., eleventh program state) P11, and sixteenth threshold voltage distribution (i.e., fifteenth program state) P15, which do not overlap.

State group codes may be assigned to the state groups GR1, GR2, GR3 and GR4. For example, a state group code '11' is assigned to the first state group GR1, a state group code '01' is assigned to the second state group GR2, a state group code '00' is assigned to the third state group GR3, and a state group code '10' is assigned to the fourth state group GR4.

The number of bits in each state group code is typically determined based on the number of the state groups, and the number of state groups is typically determined based on the maximum number of threshold voltage distributions that are overlapped in any point. In the example of FIG. 12, a maximum of four threshold voltage distributions overlap at some points, and therefore the number of state groups is four, and the number of bits of each state group code is two. For example, the second threshold voltage distribution P1 overlaps with the third through fifth threshold voltage distributions P2, P3 and P4, and four state groups are thus needed for including non-overlapping state groups.

The control circuit 500 may program the digest data DGD indicating the state group codes in the digest block DGB in the memory block.

Figure 13:
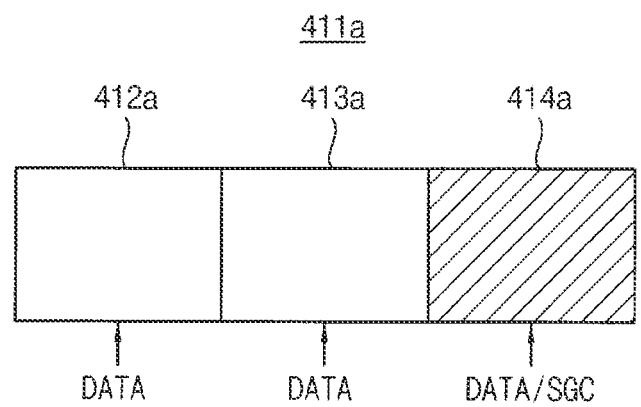
FIG. 13 illustrates a block diagram of an example of a page buffer included in the page buffer circuit in the nonvolatile memory device of FIG. 4.

FIG. 13 illustrates a block diagram of an example of a page buffer included in the page buffer circuit in the nonvolatile memory device of FIG. 4.

Referring to FIG. 13, a page buffer 411a includes a first data latch 412a, a second data latch 413a, and a third data latch 414a.

The first data latch 412a, the second data latch 413a, and the third data latch 414a may temporarily store three bits of multi-bit data DATA, respectively. For example, the first data latch 412a may store a first bit of the multi-bit data, the second data latch 413a may store a second bit of the multi-bit data, and the third data latch 414a may store a third bit of the multi-bit data. The third data latch 414a may be used as a state group code latch that temporarily stores a state group code SGC of the multi-level cell.

Figure 14:
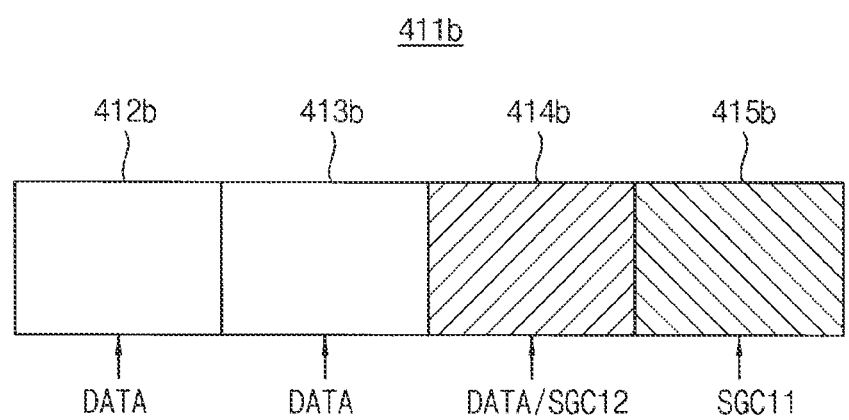
FIG. 14 illustrates a block diagram of another example of a page buffer included in the page buffer circuit in the nonvolatile memory device of FIG. 4.

FIG. 14 illustrates a block diagram of another example of a page buffer included in the page buffer circuit in the nonvolatile memory device of FIG. 4.

Referring to FIG. 14, a page buffer 411b includes a first data latch 412b, a second data latch 413b, a third data latch 414b, and a state group code latch 415b.

The first data latch 412b, the second data latch 413b, and the third data latch 414b may temporarily store three bits of multi-bit data DATA, respectively. The state group code latch 415b may temporarily store a first state group code SGC11. The third data latch 414b may be used as a stage group code latch that temporarily stores a second state group code SGC12. For example, the first state group code SGC11 may indicate a state group of a multi-level cell coupled to a currently selected word-line, and the second state group code SGC12 may indicate a state group of a multi-level cell coupled to an adjacent word-line.

Figure 15:
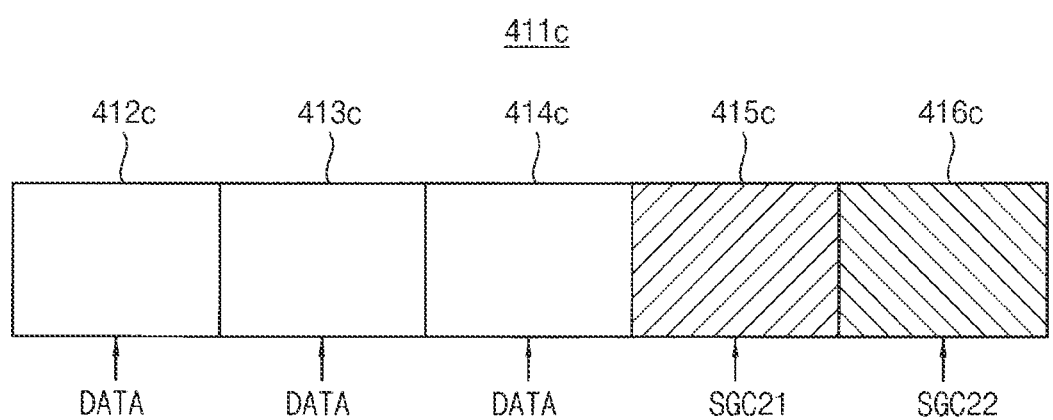
FIG. 15 illustrates a block diagram of another example of a page buffer included in the page buffer circuit in the nonvolatile memory device of FIG. 4.

FIG. 15 illustrates a block diagram of another example of a page buffer included in the page buffer circuit in the nonvolatile memory device of FIG. 4.

Referring to FIG. 15, a page buffer 411c includes a first data latch 412c, a second data latch 413c, a third data latch 414c, a first state group code latch 415c, and a second state group code latch 416c.

The first data latch 412c, the second data latch 413c, and the third data latch 414c may temporarily store three bits of multi-bit data DATA, respectively. The first state group code latch 415c may temporarily store a first state group code SGC21, and the second state group code latch 416c may temporarily store a second state group code SGC22. For example, the first state group code SGC21 may indicate a state group of a multi-level cell coupled to a currently selected word-line, and the second state group code SGC22 may indicate a state group of a multi-level cell coupled to an adjacent word-line.

In some embodiments, a state group code may be generated based on multi-bit data loaded to the page buffer 411c, and the first state group code latch 415c or the second state group code latch 416c may temporarily store the generated state group code. The page buffer 411c may further include a logic circuit that performs a logical operation on bits of the multi-bit data temporarily stored in the first data latch 412c, the second data latch 413c, and the third data latch 414c.

Figure 16:
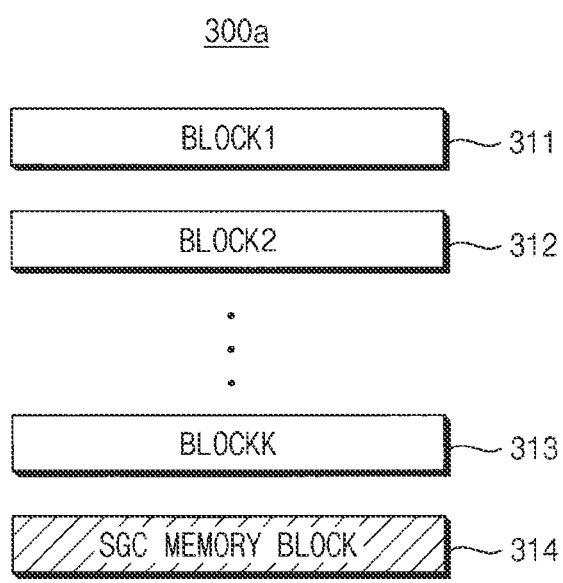
FIG. 16 illustrates a block diagram of an example of a memory cell array included in the nonvolatile memory device of FIG. 4.

FIG. 16 illustrates a block diagram of an example of a memory cell array included in the nonvolatile memory device of FIG. 4.

Referring to FIG. 16, a memory cell array 300a includes a plurality of data blocks 311, 312 and 313, and a state group code (SGC) memory block 314.

The data blocks 311 (BLOCK1), 312 (BLOCK2) and 313 (BLOCKK) may include multi-level cells that store multi-bit data. The state group code memory block 314 may store state group codes of the multi-level cells included in the data blocks 311, 312 and 313. The state group code memory block 314 may include single-level cells. In some embodiments, the state group codes may be generated based on the multi-bit data loaded to the page buffer circuit 410 in FIG. 4 for a pre-program operation, and the state group code memory block 314 may store the generated state group codes.

The memory controller may perform the pre-program operation by using at least some of the data blocks 311, 312 and 313 as a pre-grogram block PPB and may perform the digest program by using the state group code memory block 314 as the digest block.

Figure 17:
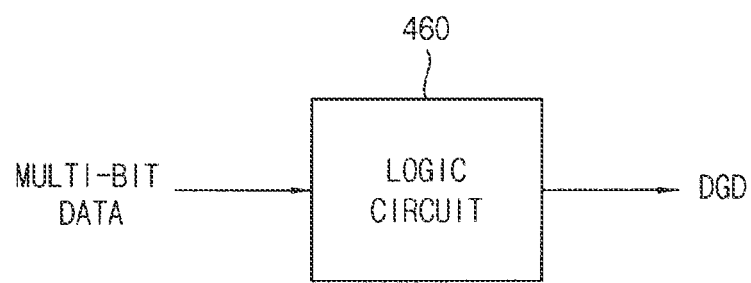
FIG. 17 illustrates a block diagram of a logic circuit included in the nonvolatile memory device of FIG. 4.

FIG. 17 illustrates a block diagram of a logic circuit included in the nonvolatile memory device of FIG. 4.

Referring to FIG. 17, a logic circuit 460 generates the digest data DGD indicating state group codes. In some embodiments, the logic circuit 460 may be included in the page buffer circuit 410 of FIG. 4. In other embodiments, the logic circuit 460 may be included in the control circuit 500 of FIG. 4. The logic circuit 460 generates the digest data DGD by performing a logical operation on bits of the multi-bit data loaded to the page buffer circuit 410 in FIG. 4 for a pre-program operation.

Figure 18:
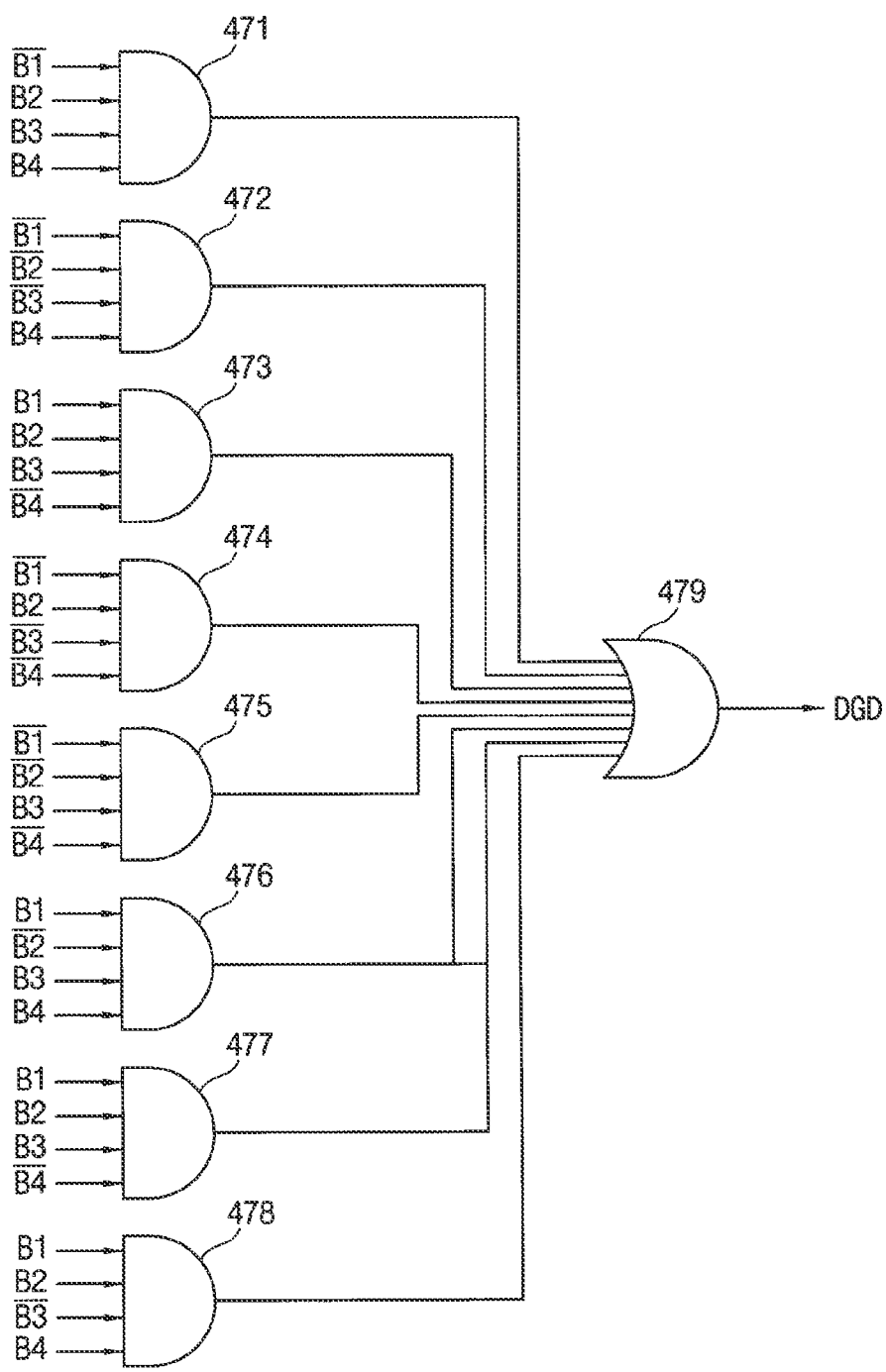
FIG. 18 illustrates a block diagram of an example of the logic circuit of FIG. 17.
Figure 19:
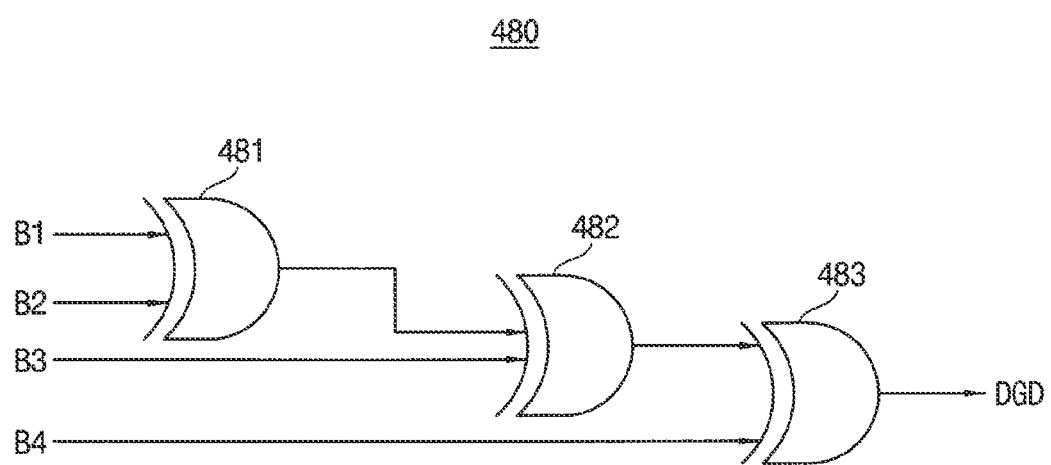
FIG. 19 illustrates a block diagram of another example of the logic circuit of FIG. 17.

FIGS. 18 and 19 illustrate block diagrams of examples of the logic circuit of FIG. 17.

Referring to FIG. 18, a logic circuit 470 includes AND gates 471 to 478 (i.e., 471, 472, 473, 474, 475, 476, 477 and 478) and an OR gate 479. AND gate 471 outputs a logic high level when a first bit B1, a second bit B2, a third bit B3 and a four bit B4 of multi-bit data are '0111'. AND gate 472 outputs the logic high level when the multi-bit data is '0001'. AND gate 473 outputs the logic high level when the multi-bit data is '1110'. AND gate 474 outputs the logic high level when the multi-bit data is '0100'. AND gate 475 outputs the logic high level when the multi-bit data is '0010'. AND gate 476 outputs the logic high level when the multi-bit data is '1011'. AND gate 477 outputs the logic high level when the multi-bit data is '1110'. AND gate 478 outputs the logic high level when the multi-bit data is '1101'. Accordingly, the logic circuit 470 outputs the digest data DGD corresponding to '1' when the multi-bit data is '0111', '0001', '1110', '0100', '0010', '1011', '1110' or '1101'.

Referring to FIG. 19, a logic circuit 480 includes XOR gates 481, 482 and 483.

The XOR gate 481 performs a logical XOR operation on a first bit B1 and a second bit B2 of multi-bit data. The XOR gate 482 performs a logical XOR operation on a third bit B3 of the multi-bit data and an output of the XOR gate 481. The XOR gate 483 performs a logical XOR operation on a fourth bit B4 of the multi-bit data and an output of the XOR gate 482 to output the output the digest data DGD. Therefore, the logic circuit 480 may output the digest data DGD corresponding to '1' when the multi-bit data is '0111', '0001', '1110', '0100', '0010', '1011', '1110' or '1101'.

While FIGS. 18 and 19 illustrate examples of the logic circuit 460, the logic circuit 460 may be implemented with various circuits. Further, the logic circuit 460 may have various forms according to the number of bits of the multi-bit data.

Figure 20:
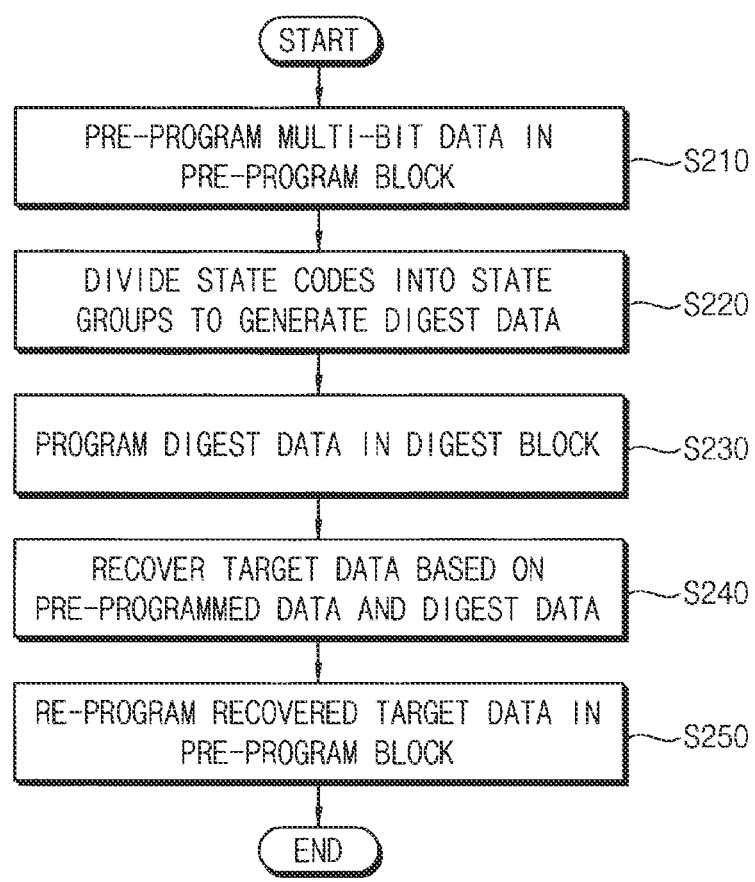
FIG. 20 illustrates a flow chart of a method of operating a storage device according to embodiments of the inventive concepts.

FIG. 20 illustrates a flow chart of a method of operating a storage device according to embodiments of the inventive concepts.

Referring to FIGS. 1 through 20, there is provided a method of operating a storage device that includes a nonvolatile memory device 200 and a controller 100 that controls the nonvolatile memory device 200. The nonvolatile memory device 200 includes a memory cell array 300 including a plurality of memory blocks and each of the memory blocks includes a plurality of pages. In operation S210, the control circuit 500 controls the voltage generator 700, the address decoder 430 and the page buffer circuit 410 to perform a pre-program PRE_PGM to pre-program multi-bit data in multi-level cells in a pre-program block PPB of the memory blocks.

In operation S220, the control circuit 500 divides the multi-level cells into a plurality of state groups based on state codes indicating states of the multi-level cells, to generate digest data DGD indicating state group codes corresponding to the state groups.

In operation S230, the control circuit 500 controls the voltage generator 700, the address decoder 430 and the page buffer circuit 410 to perform digest program DG_PGM to program digest data DGD in a digest block DGB of the memory blocks.

In operation S240, the controller (the memory controller) 100 recovers target data based on the pre-programmed data and the digest data DGD. The controller 100 may recover the target data by performing logical operation on the pre-programmed data and the digest data DGD by using a logic circuit. In operation S250, the controller 250 re-programs the recovered target data in multi-level cells in the pre-program block PPB.

Figure 21A:
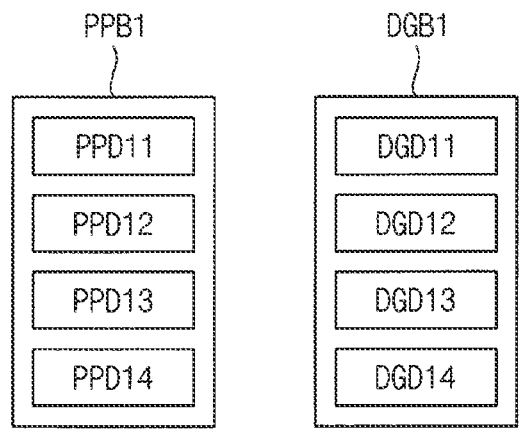
FIGS. 21A, 21b and 21C illustrate diagrams explanatory of operation of the storage device of FIG. 2.
Figure 21B:
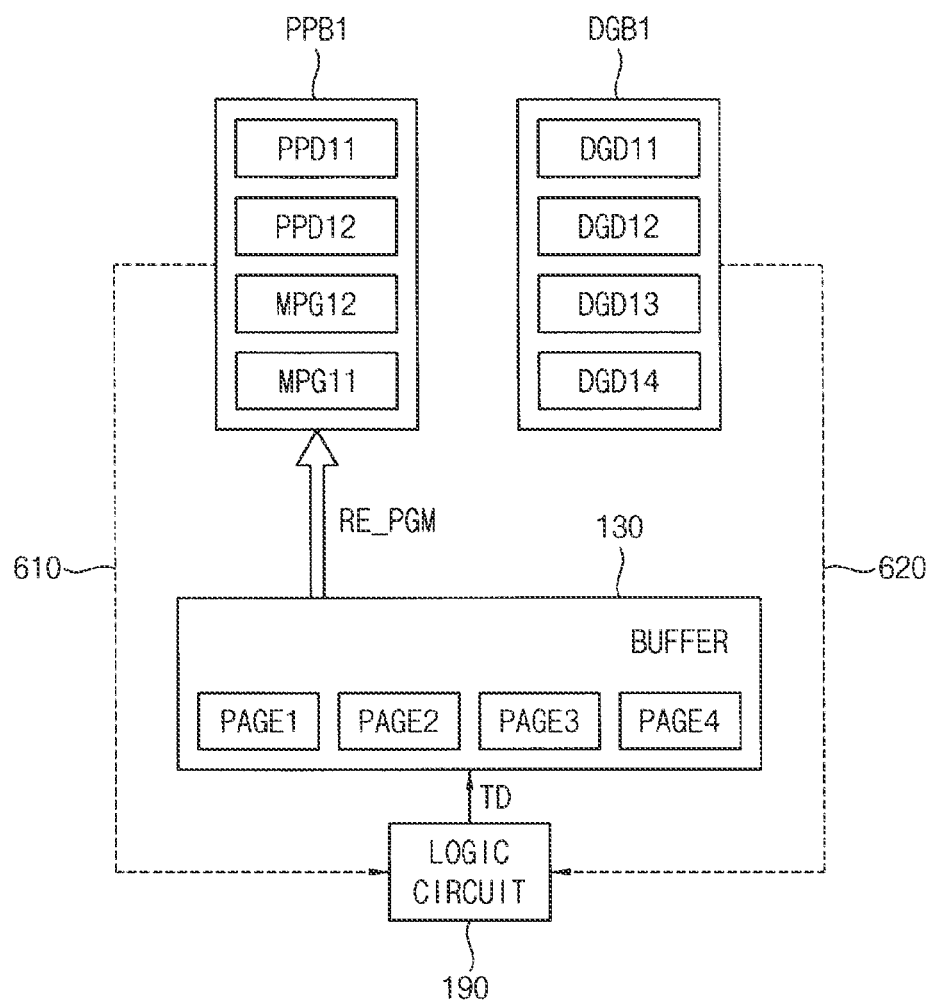
Figure 21C:
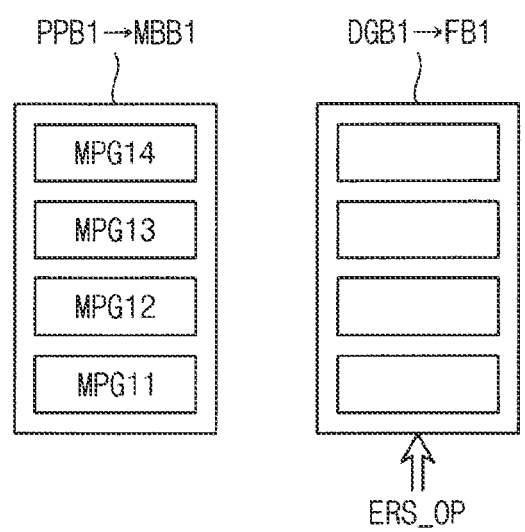

FIGS. 21A through 21C illustrate diagrams explanatory of operation of the storage device of FIG. 2.

Referring to FIGS. 2, 3, 4 and 21A, the control circuit 500 controls the voltage generator 700, the address decoder 430 and the page buffer circuit 410 to pre-program multi-level data in multi-level cells in a pre-program block PPB1, and to program digest data in a digest block DGB1. When the pre-program and the digest program are completed, pre-programmed multi-bit data PPD11, PPD12, PPD13 and PPD14 are stored in the pre-program block PPB1, and digest data DGD11, DGD12, DGD13 and DGD14 are stored in the digest block DGB1. The pre-programmed multi-bit data PPD11, PPD12, PPD13 and PPD14 correspond to the digest data DGD11, DGD12, DGD13 and DGD14, respectively. For example, the pre-program block PPB1 and the digest block DGB1 may constitute one pair.

Referring to FIG. 21B, the controller 100 provides the pre-programmed multi-bit data PPD11, PPD12, PPD13 and PPD14 to a logic circuit 190 in the controller 100 (as indicated by reference numeral 610) and the controller 100 migrates the digest data DGD11, DGD12, DGD13 and DGD14 to the logic circuit 190 (as indicated by reference numeral 620).

The logic circuit 190 recovers target data TD by performing logic operation on the pre-programmed multi-bit data PPD11, PPD12, PPD13 and PPD14 and the digest data DGD11, DGD12, DGD13 and DGD14. The logic circuit 190 stores the recovered target data TD in the buffer 130 by unit of pages PAGE1, PAGE2, PAGE3 and PAGE4, and the controller 100 re-programs the target data TD in the buffer 130 in the multi-level cells in the pre-program block PPB1 (as indicated by reference character RE_PGM). Therefore, some pre-programmed multi-bit data PPD13 and PPD14 of the pre-programmed multi-bit data PPD11, PPD12, PPD13 and PPD14 are changed to multi-page data MPG11 and MPG12. Each of multi-page data MPG11 and MPG12 includes a plurality of pages of data.

Referring to FIG. 21C, if the re-program is completed and migration of the digest data DGD11, DGD12, DGD13 and DGD14 in the digest block DGB1 is completed, multi-page data MPG11, MPG12, MPG13 and MPG14 are stored in the pre-program block PPB1. Therefore, the controller 100 changes the pre-program block PPB1 to a multi-bit block MBB1, the multi-bit block MBB1 stores the multi-page data MPG11, MPG12, MPG13 and MPG14, and each of the multi-page data MPG11, MPG12, MPG13 and MPG14 includes a plurality of pages of data. In addition, the controller 100 changes the digest block DGB1 to a free block FB1 that does not store data by performing erase operation ERS_OP on the digest block DGB1.

Figure 22:
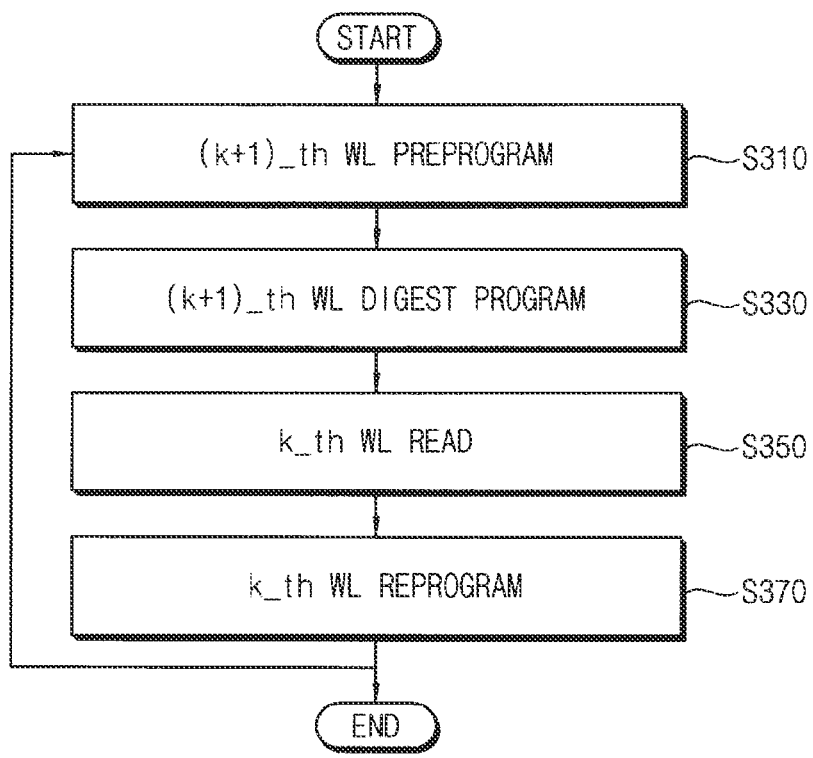
FIG. 22 illustrates a flow chart of a method of operating a nonvolatile memory device according to embodiments of the inventive concepts.

FIG. 22 illustrates a flow chart a method of operating a nonvolatile memory device according to embodiments of the inventive concepts.

Referring to FIGS. 4 through 19 and 22, after a pre-program operation and a digest program for multi-level cells coupled to a next word-line are performed, a read operation and a re-program operation for multi-level cells coupled to a current word-line are performed.

For example, multi-bit data are pre-programmed in multi-level cells coupled to a (k+1)-th word-line (WL) in operation S310, and digest data are generated based on state codes of the multi-level cells in a page corresponding to the (k+1)-th word-line in operation S330. After the pre-program operation for the multi-level cells coupled to the (k+1)-th word-line, data is read from multi-level cells coupled to a k-th word-line in operation S350, and multi-bit data are re-programmed in the multi-level cells coupled to the k-th word-line in operation S370.

As described above, since a read operation and a re-program operation for a word-line are performed after the pre-program operation for a next word-line is performed, the multi-level cells coupled to the word-line may be less affected by coupling due to memory cells coupled to the next word-line.

Figure 23:
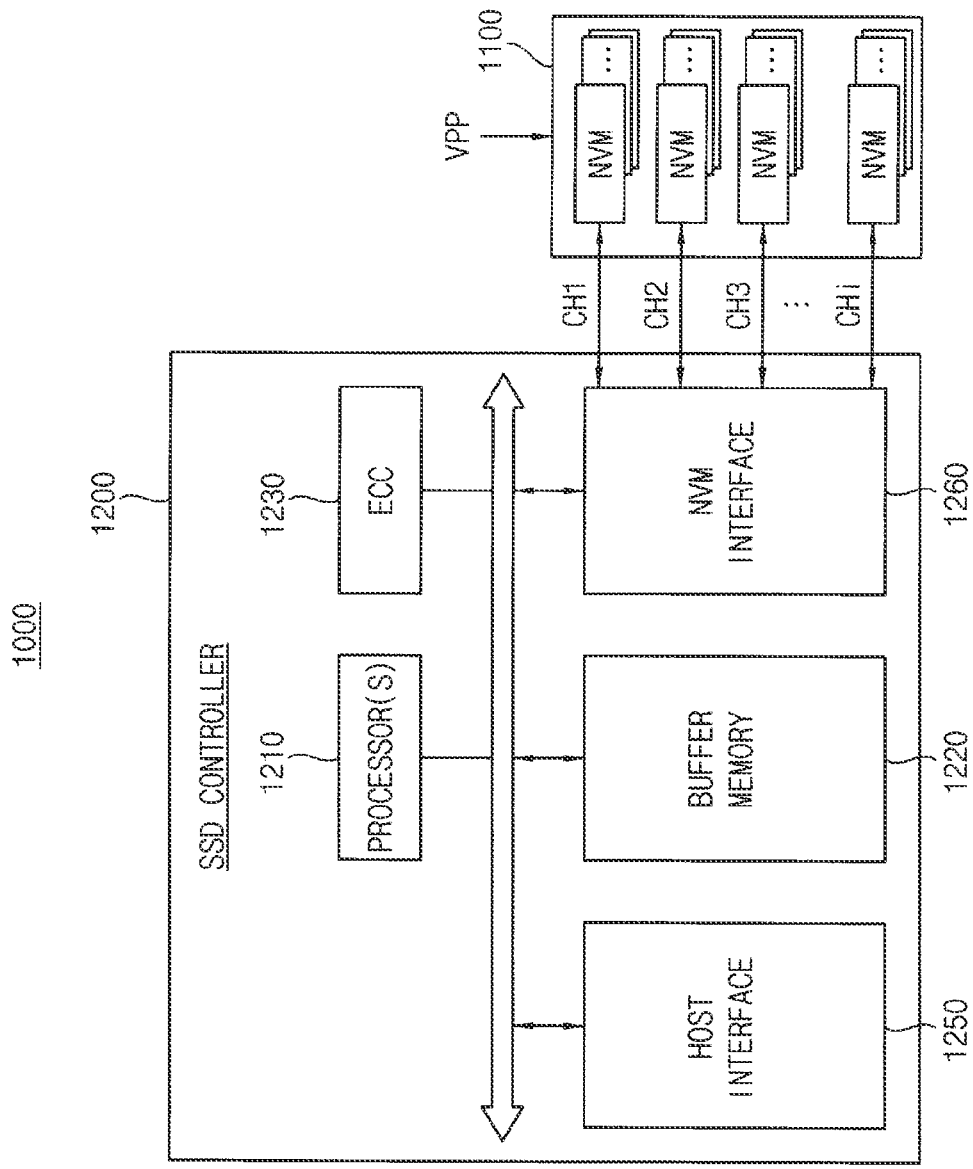
FIG. 23 illustrates a block diagram of a solid state disk or solid state drive (SSD) according to embodiments of the inventive concepts.

FIG. 23 illustrates a block diagram of a solid state disk or solid state drive (SSD) according to embodiments of the inventive concepts.

Referring to FIG. 23, an SSD 1000 includes multiple nonvolatile memory devices 1100 and an SSD controller 1200.

The nonvolatile memory devices 1100 may be optionally supplied with an external high voltage VPP. Each of the nonvolatile memory devices 1100 may include the nonvolatile memory device 200 of FIG. 4. Therefore, each of the nonvolatile memory devices 1100 pre-programs multi-bit data in multi-bit cells in a pre-program block, and programs digest data generated based on state codes of the pre-programmed multi-bit data, in a digest block. Accordingly, each of the nonvolatile memory devices 1100 may enhance program performance and efficiency of storage space.

The SSD controller 1200 is connected to the nonvolatile memory devices 1100 through multiple channels CH1, CH2, CH3 to CHi. The SSD controller 1200 includes one or more processors 1210, a buffer memory 1220, an ECC engine 1230, a host interface 1250, and a nonvolatile memory interface 1260.

The buffer memory 1220 stores data used to drive the SSD controller 1200. The buffer memory 1220 includes multiple memory lines each storing data or a command. The ECC engine 1230 calculates error correction code values of data to be programmed at a writing operation and corrects an error of read data using an error correction code value at a read operation. In a data recovery operation, the ECC engine 1230 corrects an error of data recovered from the nonvolatile memory devices 1100.

A nonvolatile memory device or a storage device according to example embodiments may be packaged using various package types or package configurations.

The embodiments of the inventive concepts may be applied to various electronic devices including nonvolatile memory devices. For example, the embodiments of the inventive concepts may be applied to systems such as be mobile phones, smart phones, personal digital assistants (PDAs), portable multimedia players (PMPs), digital cameras, camcorders, personal computers (PCs), server computers, workstations, laptop computers, digital TVs, set-top boxes, portable game consoles, navigation systems, or the like.

The foregoing is illustrative of example embodiments and is not to be construed as limiting thereof. Although a few example embodiments have been described, those skilled in the art will readily appreciate that many modifications of the example embodiments are possible without materially departing from the novel teachings and advantages of the inventive concepts. Accordingly, all such modifications are intended to be included within the scope of the inventive concepts as defined in the claims.

What is claimed is:

1. A storage device comprising:
a nonvolatile memory including a plurality of memory blocks that includes a pre-program block and a digest block, the pre-program block including a plurality of first cells, the digest block including a plurality of second cells; and
a memory controller configured to pre-program data in the plurality of first cells, to divide the plurality of first cells into a plurality of state groups, to generate digest data indicating state group codes corresponding to the plurality of state groups, to program the digest data stored in the digest block, and to control the pre-program block and the digest block as one pair, wherein
each of the plurality of first cells stores more bits than each of the plurality of second cells.

2. The storage device of claim 1, wherein each of the plurality of first cells stores two bits, and each of the plurality of second cells stores one bit.

3. The storage device of claim 1, wherein each of the plurality of first cells stores four bits, and each of the plurality of second cells stores two bits.

4. The storage device of claim 1, wherein the memory controller is configured to divide the plurality of first cells into the plurality of state groups based on state codes that indicate states of the plurality of first cells after the data is pre-programmed.

5. The storage device of claim 1, wherein each of the plurality of state groups includes a set of non-overlapping threshold voltage distributions.

* * * * *